United States Patent
Sheu et al.

(10) Patent No.: US 8,378,422 B2
(45) Date of Patent: Feb. 19, 2013

(54) ELECTROSTATIC DISCHARGE PROTECTION DEVICE COMPRISING A PLURALITY OF HIGHLY DOPED AREAS WITHIN A WELL

(75) Inventors: Ming-Song Sheu, Hsin-Chu (TW); Jian-Hsing Lee, Hsin-Chu (TW); Yao-Wu Feng, Miao-Li Hsien (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 115 days.

(21) Appl. No.: 12/609,803

(22) Filed: Oct. 30, 2009

(65) Prior Publication Data

US 2010/0200922 A1  Aug. 12, 2010

Related U.S. Application Data

(60) Provisional application No. 61/150,542, filed on Feb. 6, 2009.

(51) Int. Cl.
*H01L 23/62* (2006.01)
*H01L 29/72* (2006.01)
*H01L 29/74* (2006.01)
*H01L 31/111* (2006.01)

(52) U.S. Cl. ........ 257/355; 257/173; 257/174; 257/356; 257/357; 257/E29.06

(58) Field of Classification Search .......... 257/173, 257/174, 355, 356, 357, E29.006
See application file for complete search history.

(56) References Cited

U.S. PATENT DOCUMENTS

| | | | | |
|---|---|---|---|---|
| 4,697,332 A * | 10/1987 | Joy et al. | 438/420 |
| 5,455,436 A * | 10/1995 | Cheng | 257/356 |
| 5,504,362 A * | 4/1996 | Pelella et al. | 257/357 |
| 5,670,814 A * | 9/1997 | Wu et al. | 257/360 |
| 5,760,446 A * | 6/1998 | Yang et al. | 257/357 |
| 5,847,429 A * | 12/1998 | Lien et al. | 257/355 |
| 5,994,732 A * | 11/1999 | Ajika et al. | 257/315 |
| 6,046,087 A * | 4/2000 | Lin et al. | 438/279 |
| 6,060,752 A * | 5/2000 | Williams | 257/355 |
| 6,066,879 A * | 5/2000 | Lee et al. | 257/355 |
| 6,093,588 A * | 7/2000 | De Petro et al. | 438/180 |
| 6,121,657 A * | 9/2000 | Yama | 257/341 |
| 6,133,107 A * | 10/2000 | Menegoli | 438/306 |
| 6,180,993 B1 * | 1/2001 | Wang et al. | 257/529 |
| 6,365,932 B1 * | 4/2002 | Kouno et al. | 257/341 |
| 6,365,939 B1 * | 4/2002 | Noguchi | 257/355 |
| 6,399,991 B1 * | 6/2002 | Ando | 257/355 |
| 6,441,439 B1 * | 8/2002 | Huang et al. | 257/355 |
| 6,479,870 B1 * | 11/2002 | Chen et al. | 257/356 |
| 7,074,659 B2 * | 7/2006 | Zuniga et al. | 438/197 |
| 7,091,079 B2 * | 8/2006 | Chen et al. | 438/199 |
| 7,202,529 B2 * | 4/2007 | Krumbein et al. | 257/343 |
| 7,217,966 B1 * | 5/2007 | Vashchenko et al. | 257/210 |
| 7,256,092 B2 * | 8/2007 | Chen et al. | 438/275 |
| 7,274,071 B2 * | 9/2007 | Ando et al. | 257/355 |
| 7,323,753 B2 * | 1/2008 | Henmi et al. | 257/379 |
| 7,476,945 B2 * | 1/2009 | Yamada | 257/401 |
| 7,642,621 B2 * | 1/2010 | Takahashi | 257/566 |
| 7,671,416 B1 * | 3/2010 | O et al. | 257/360 |
| 7,763,908 B2 * | 7/2010 | Chen | 257/107 |
| 7,786,507 B2 * | 8/2010 | Denison et al. | 257/173 |

(Continued)

*Primary Examiner* — Ida M Soward (74) *Attorney, Agent, or Firm* — Slater & Matsil, L.L.P.

(57) ABSTRACT

Embodiments of the invention relate to an electrostatic discharge (ESD) device and method for forming an ESD device. An embodiment is an ESD protection device comprising a p well disposed in a substrate, an n well disposed in the substrate, a high voltage n well (HVNW) disposed between the p well and the n well in the substrate, a source n+ region disposed in the p well, and a plurality of drain n+ regions disposed in the n well.

19 Claims, 9 Drawing Sheets

U.S. PATENT DOCUMENTS

| | | | |
|---|---|---|---|
| 7,808,069 B2* | 10/2010 | Ho et al. | 257/484 |
| 7,812,393 B2* | 10/2010 | Williams et al. | 257/335 |
| 7,838,924 B2* | 11/2010 | Boselli et al. | 257/328 |
| 7,858,466 B2* | 12/2010 | Huang et al. | 438/220 |
| 7,888,767 B2* | 2/2011 | Huang et al. | 257/487 |
| 7,923,805 B2* | 4/2011 | Chang et al. | 257/500 |
| 7,928,508 B2* | 4/2011 | Yao et al. | 257/342 |
| 8,049,307 B2* | 11/2011 | Jou et al. | 257/556 |
| 2002/0017690 A1* | 2/2002 | Hayashida | 257/355 |
| 2003/0213995 A1* | 11/2003 | Duvvury et al. | 257/355 |
| 2005/0045955 A1* | 3/2005 | Kim et al. | 257/355 |
| 2005/0073007 A1* | 4/2005 | Chen et al. | 257/355 |
| 2005/0185074 A1* | 8/2005 | Yoneda et al. | 348/294 |
| 2006/0006462 A1* | 1/2006 | Chang et al. | 257/341 |
| 2006/0081935 A1* | 4/2006 | Morishita | 257/361 |
| 2007/0063264 A1* | 3/2007 | Huang et al. | 257/321 |
| 2007/0241422 A1* | 10/2007 | Chen | 257/528 |
| 2008/0174924 A1* | 7/2008 | Kang et al. | 361/56 |
| 2008/0296669 A1* | 12/2008 | Pendharkar et al. | 257/329 |
| 2009/0152633 A1* | 6/2009 | Takasu et al. | 257/360 |
| 2009/0224333 A1* | 9/2009 | Lu et al. | 257/392 |
| 2009/0294865 A1* | 12/2009 | Tang et al. | 257/369 |
| 2010/0006933 A1* | 1/2010 | Huang et al. | 257/336 |

* cited by examiner

ELECTROSTATIC DISCHARGE PROTECTION DEVICE COMPRISING A PLURALITY OF HIGHLY DOPED AREAS WITHIN A WELL

This application claims the benefit of U.S. Provisional Patent Application Ser. No. 61/150,542, filed on Feb. 6, 2009, and entitled "Electrostatic Discharge Protection Device and Method," which application is incorporated herein by reference.

TECHNICAL FIELD

This invention relates generally to electrostatic discharge (ESD) protection devices and methods, and more particularly to ESD protection devices protecting high voltage semiconductor devices and methods for forming an ESD protection device.

BACKGROUND

Static charge can result in extremely high voltages near an integrated circuit that can lead to the integrated circuit being subjected to an electrostatic discharge (ESD) event. When electrostatic energy is discharged, a high current can be produced through devices of the integrated circuit. For example, when a person carrying a static charge touches a pin of a package of the integrated circuit, a discharge of the static charge onto the integrated circuit can cause a high voltage and a high current to be generated to an input or output buffer of the integrated circuit. ESD is a serious problem for semiconductor devices since it has the potential to destroy the device and the entire integrated circuit.

ESD protection devices are generally integrated into integrated circuits. An ESD protection device can provide a current path so that when an ESD transient occurs, the ESD current is conducted through the ESD protection device without going through the devices being protected. High voltage N well (HVNW) devices are conventionally used in ESD protection devices, particularly for protecting high voltage semiconductor devices.

SUMMARY OF THE INVENTION

In accordance with an embodiment of the present invention, an electrostatic discharge (ESD) protection device comprises a p well disposed in a substrate, an n well disposed in the substrate, a high voltage n well (HVNW) disposed between the p well and the n well in the substrate, a source n+ region disposed in the p well, and a plurality of drain n+ regions disposed in the n well.

In accordance with another embodiment of the present invention, a drain for an ESD device, the drain comprises a doped well, a plurality of highly doped areas within the doped well, and a plurality of contacts. Each highly doped area is physically isolated from all other highly doped areas, and at least one contact is electrically coupled to each highly doped area.

In accordance with another embodiment of the present invention, a method of forming an electrostatic discharge device, the method comprises forming a p well in a semiconductor substrate, forming a high voltage n well in the semiconductor substrate, forming a deep n well in the high voltage n well, and forming n+ regions in the deep n well.

An advantage of embodiments of the present invention is that current flowing through the ESD device can distribute more uniformly throughout contacts in the drain. This prevents current crowding in certain contacts that could lead to thermal fatigue and device failure.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the present embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in a specific context, namely an ESD protection device.

Figure 1:
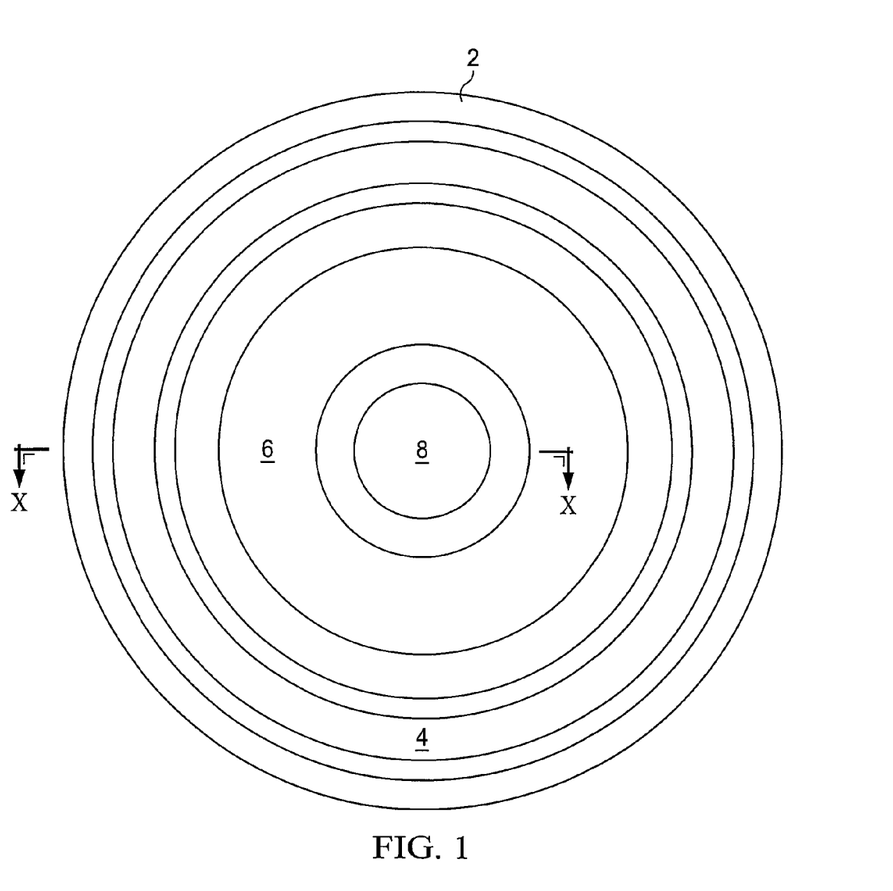
FIG. 1 is a layout of a conventional HVNW device.

FIG. 1 shows a conventional HVNW device. A p+ doped guard-ring 2 surrounds the circular device. Inside of the guard-ring 2 is an n+ doped source 4. Inside the source 4 is the high voltage N well (HVNW) 6 and then the n+ doped drain 8.

Figure 2:
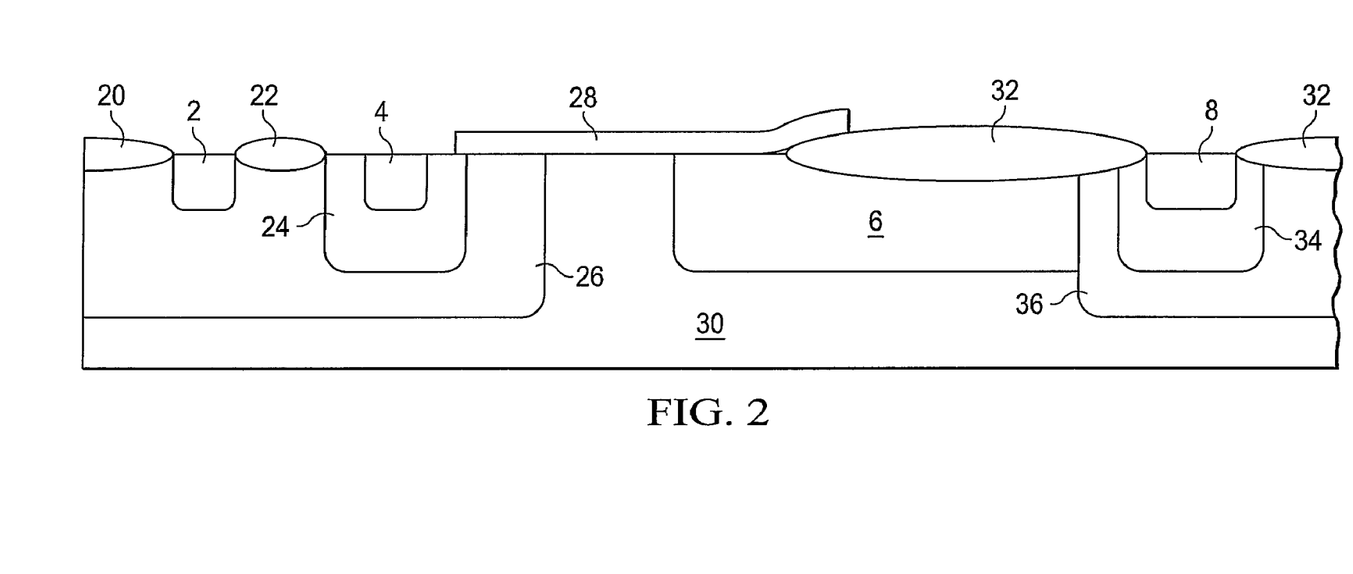
FIG. 2 is a cross-sectional view of the conventional HVNW device.

FIG. 2 is a cross-sectional view of the conventional device in FIG. 1 along line X-X. Two field oxides 20 and 22 isolate the guard-ring 2. The source 4 is in an n drain diffuse region 24. Both the guard-ring 2 and the n doped region 24 are in a p doped well 26. A gate structure 28 above the substrate 30 extends from the inner edge of the n doped region 24 to and partially covering another field oxide 32. Part of the gate 28 and the field oxide 32 cover the HVNW 6. The field oxide 32 extends to the outer edge of the drain 8. The drain 8 is in an n drain diffuse region 34 within an n well 36. The n well 36 extends to the HVNW 6.

Generally, the conventional device is electrically coupled between input/output pads of the integrated circuit. When a transient occurs, the device activates and conducts current away from other devices on the integrated circuit.

Figure 3A:
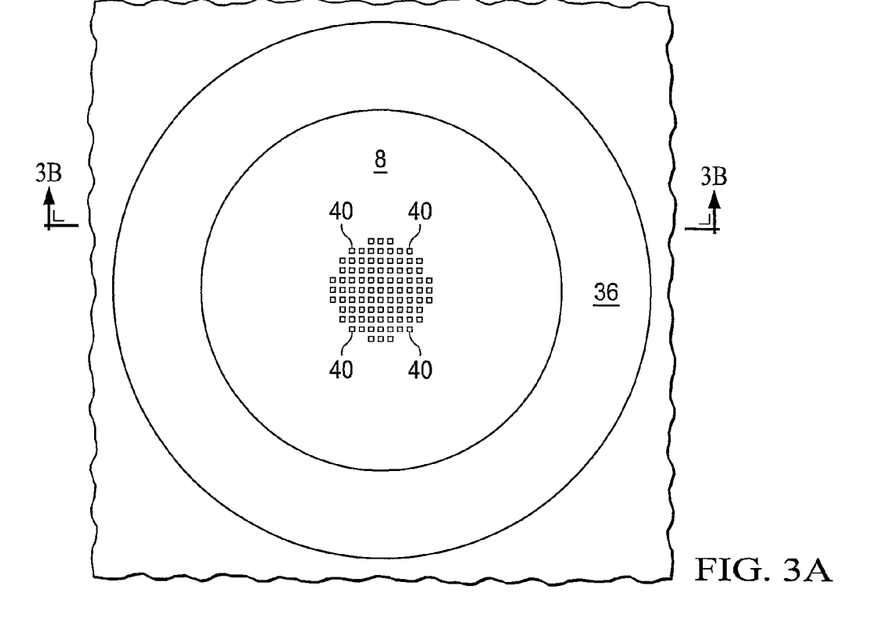
FIG. 3A is a plan view of the drain of the conventional HVNW device.
Figure 3B:
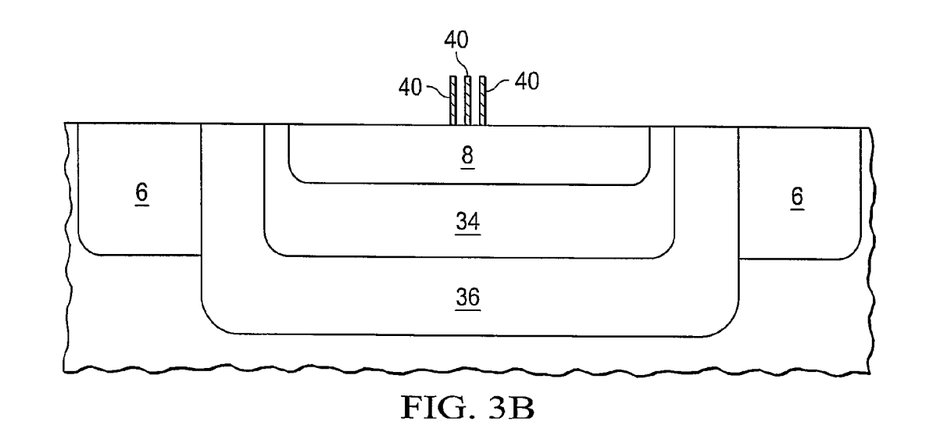
FIG. 3B is a cross-sectional view of the drain of the conventional HVNW device.

FIGS. 3A and 3B are views of the drain 8 of the conventional device. FIG. 3A is a plan view of the drain 8. FIG. 3B is a cross-sectional view of the drain 8. In both figures, the n+ doped drain 8 is made up of one n+ doped region with multiple contacts 40. The contacts 40 are tightly concentrated in the center of drain 8. Typically, the contacts 40 are concentrated within an area of having a diameter of about 12 micrometers in the drain 8 that has a diameter of about 50 micrometers.

As will be discussed in more detail below, the concentration of the contacts 40 within a single n+ doped region can result in current crowding in contacts 40 near the edge of the grouping. The paths between contacts near the edge of the group and the source have a lower resistance than paths between inner contacts and the source. Thus, more current will generally flow through the outer contacts. The increase in current flow through the outer contacts can lead to thermal failure of those contacts that will eventually result in total device failure.

Figure 4A:
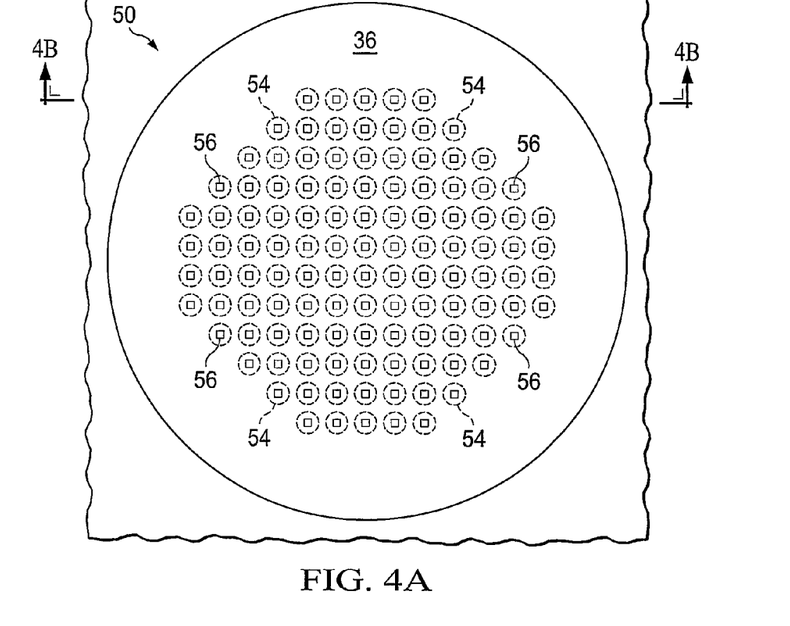
FIG. 4A is a plan view of a drain of an electrostatic discharge device in accordance with an embodiment.
Figure 4B:
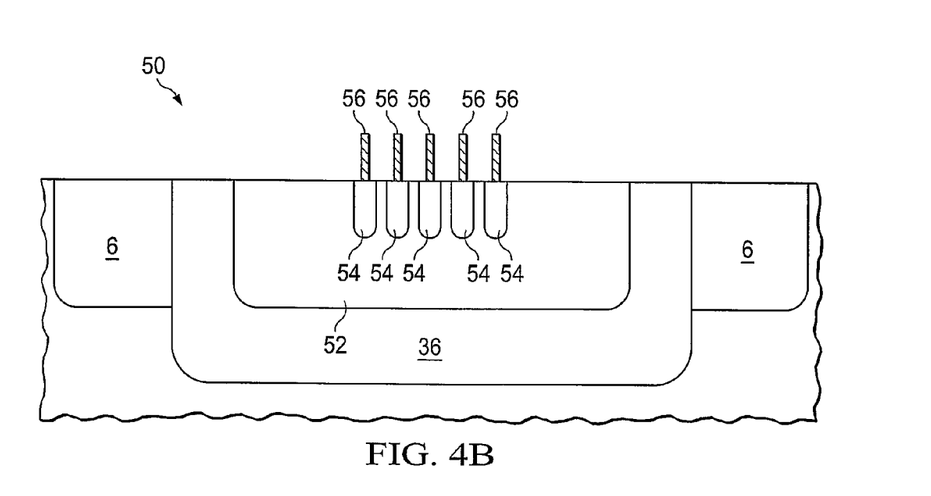
FIG. 4B is a cross-sectional view of the drain of an electrostatic discharge device in accordance with an embodiment.

FIGS. 4A and 4B are views of an embodiment of the invention. FIG. 4A is a plan view of a drain 50, and FIG. 4B is a cross-sectional view of the drain 50. In both figures, within the n drain diffuse region 52 are multiple n+ doped regions 54 that compose the drain 50. Each n+ doped region 54 has a contact 56. Each of the n+ doped regions 54 may have an area of between 4 and 6 square micrometers, and the n well 36 may have an area of between 4,000 and 5,000 square micrometers, although other areas may be used. In this embodiment, each n+ doped region 54 has a diameter of approximately 2.5 micrometers, and the n well 36 has a diameter of approximately 75 micrometers, or in other words, areas of approximately 4.91 square micrometers and 4,420 square micrometers, respectively. However, a person of ordinary skill in the art will know that these measurements may be increased or decreased according to the technical requirements of the application.

Further, an embodiment of this invention has approximately one hundred n+ doped regions 54, although this may also be varied. The n+ doped regions 54 may be concentrated in an area between 2,000 and 2,500 square micrometers. In this embodiment, these n+ doped regions 54 are concentrated in an area of approximately 2,200 square micrometers centrally located within the n well 36. Each n+ doped region 54 has edges that are at least approximately one micrometer from all edges of other n+ doped regions 54. Therefore, at least approximately one micrometer space acts as a buffer between all of the n+ doped regions 54. Accordingly, a concentration of the n+ doped regions 54 may be between one n+ region 54 per 15 square micrometers and one n+ region 54 per 25 square micrometers. In this embodiment, the concentration of the n+ doped regions 54 is approximately one per 19 square micrometers within the n well. Although the foregoing dimensions have been discussed with regard to a specific embodiment, a person having ordinary skill in the art will understand that the dimensions may be varied according to any specific application and still remain within the scope of the invention.

By creating multiple individual n+ doped regions 54 with each one having a contact 56, embodiments may take advantage of a characteristic of the general n+ doped region or drain to avoid excess current flow through outer contacts that could damage the contacts. Generally, as the current flow increases through an n+ doped region or drain, the resistance also increases within the n+ doped region or drain. Further, it is generally known that the distance between two contacts can affect the resistance between the two contacts; particularly within a semiconductor device, a longer distance usually causes a larger resistance between two contacts assuming all junctions or other variables are equal.

Accordingly, for the conventional device in FIGS. 3A and 3B, the resistance between the n+ doped source 4 is the smallest to the outer contacts closest to the n+ doped source 4 of the current. Because all of the contacts 40 are within the single n+ doped drain 8, all other variables are equal, and the conventional device cannot advantageously use the resistance characteristic of the n+ doped drain 8 to affect the current flowing through each contact 40 because the n+ doped drain 8 is common to all contacts 40. Therefore, when an ESD event occurs and current flows to the n+ doped drain 8, the outer contacts 40 are likely to receive high amounts of current because of the lowest resistance path, and those contacts 40 may fail due to thermal failure of the contact caused by the high current.

However, embodiments contain multiple n+ doped regions 54 with each having a contact 56. Because of this, each n+ doped region 54 may effectively clamp the current through each contact 56. Before an ESD event occurs, usually the n+ doped regions 54 do not determine which contact 56 has the least resistance to the source, but rather, the distance between the source and each contact 56 determines which contact 56 has the least resistance. Accordingly, at the onset of an ESD event, current is more likely to flow through the n+ doped regions 54 and contacts 56 of the outer most contacts 56. But as the current flow increases through those n+ doped regions 54, the resistance of the n+ doped region 54 through which the current flows increases. From this, the resistance of the outer contacts 56 increases to a point where the resistance through the outer contacts is greater than some inner contacts 56. Thus, current will begin to flow through the inner contacts 56. This can be done because of the separate n+ doped regions 54 for each contact 56. By separating the n+ doped regions 54, the resistance characteristic for a single contact 56 can operate independently from other contacts 56. Contrast this to the conventional device, this characteristic could not be exploited because the resistance of the n+ doped drain 8 did not operate independently for differing contacts 40. Therefore, embodiments allow current to flow through the contacts 56 more uniformly to decrease the risk of thermal failures of those contacts 56.

Figure 5A:
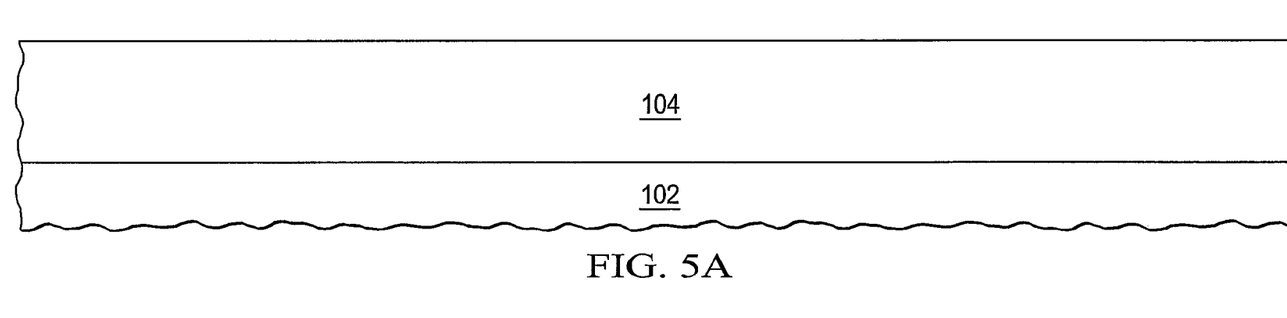
FIGS. 5A through 5J are a process for building an electrostatic discharge device in accordance with an embodiment.
Figure 5B:
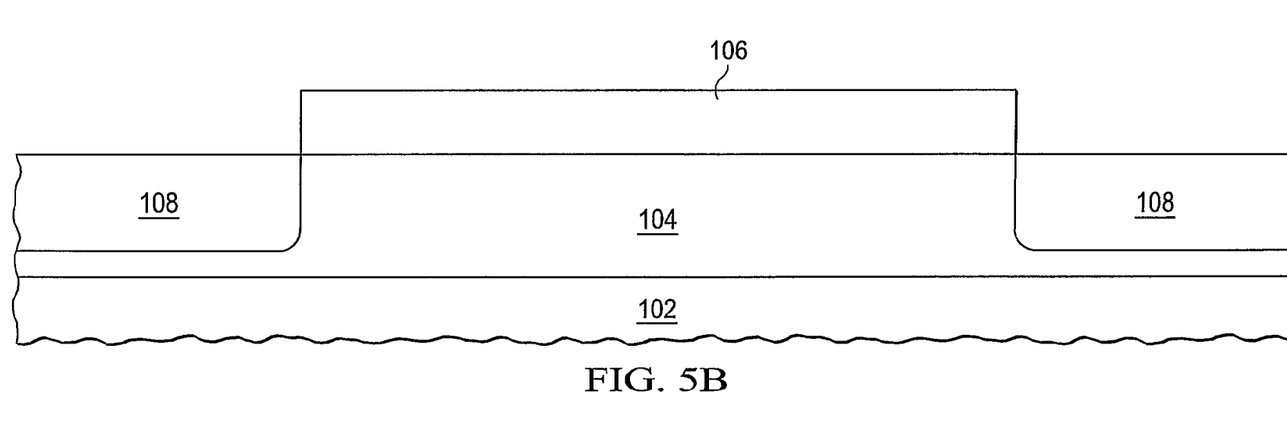
Figure 5C:
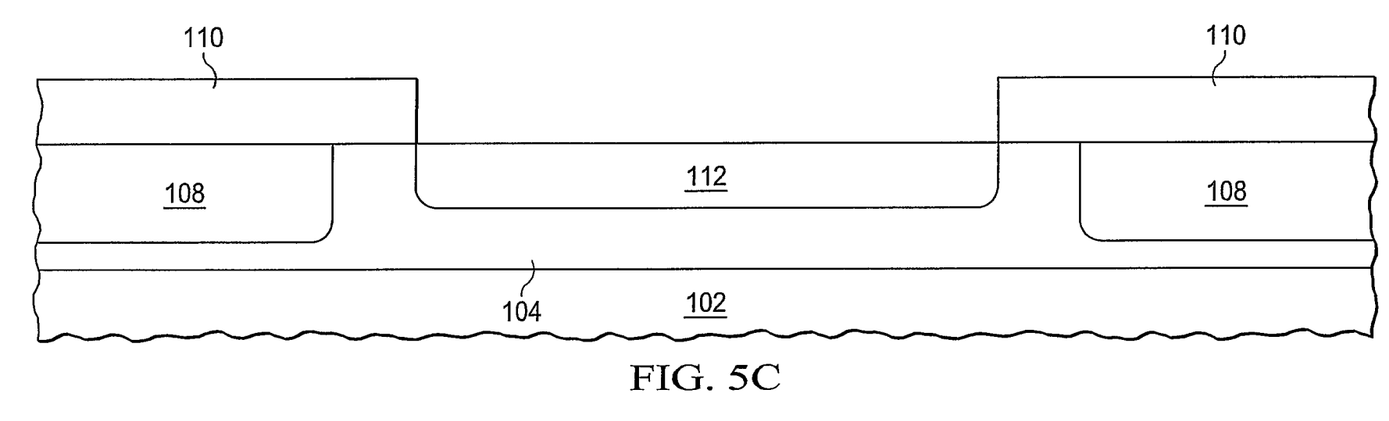

FIGS. 5A through 5J illustrate a process for building an ESD device in accordance with embodiments of the invention. In FIG. 5A, an epitaxial substrate 104 is formed on a substrate 102. In FIG. 5B, a resist layer 106 is patterned to expose an area of the epitaxial substrate where a p well 108 is to be formed. The epitaxial substrate 104 is doped with p type dopants to form the p well 108, and the resist layer 106 is removed. In FIG. 5C, a resist layer 110 is patterned on the epitaxial substrate 104 to expose an area of the epitaxial substrate 104 where a HVNW 112 is to be formed. The epitaxial substrate is doped with n type dopants to form the HVNW 112. Then, the resist layer 110 is removed.

Figure 5D:
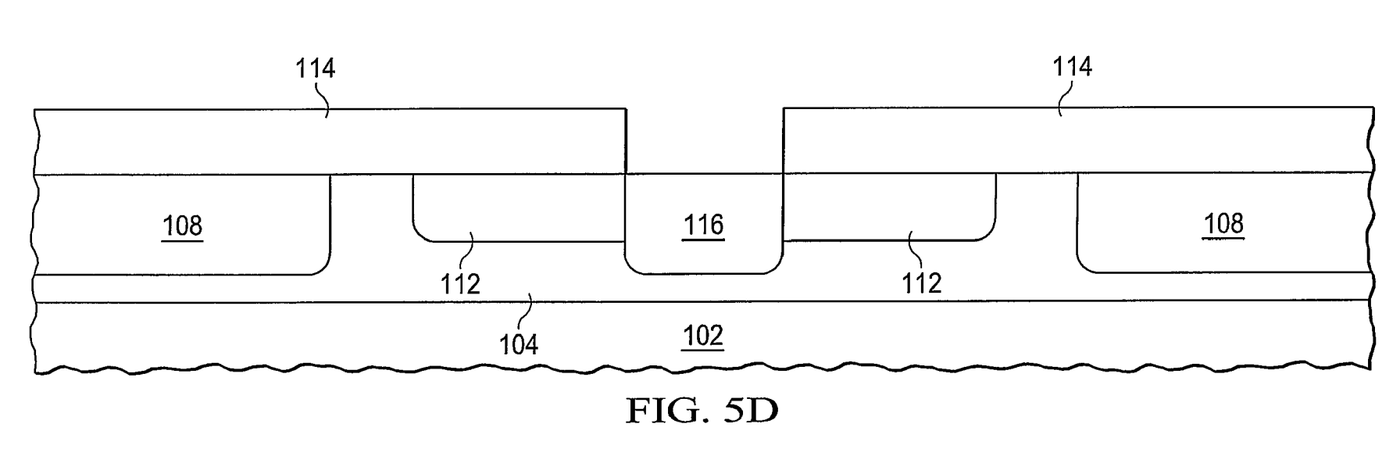

In FIG. 5D, a resist layer 114 is formed exposing an area of the epitaxial substrate 104 where a deep n well 116 is to be formed. The epitaxial substrate 104 is then doped using n type dopants to form the deep n well 116.

Figure 5E:
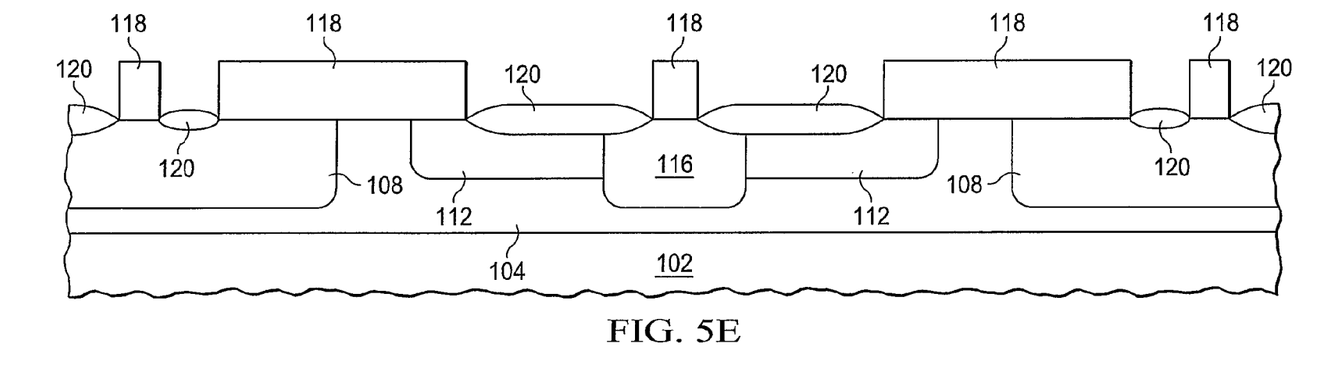

In FIG. 5E, field oxides 120 are formed on the epitaxial substrate 104 in areas exposed by a hardmask layer 118. The field oxides 120 could alternatively be shallow trench isolations (STIs).

Figure 5F:
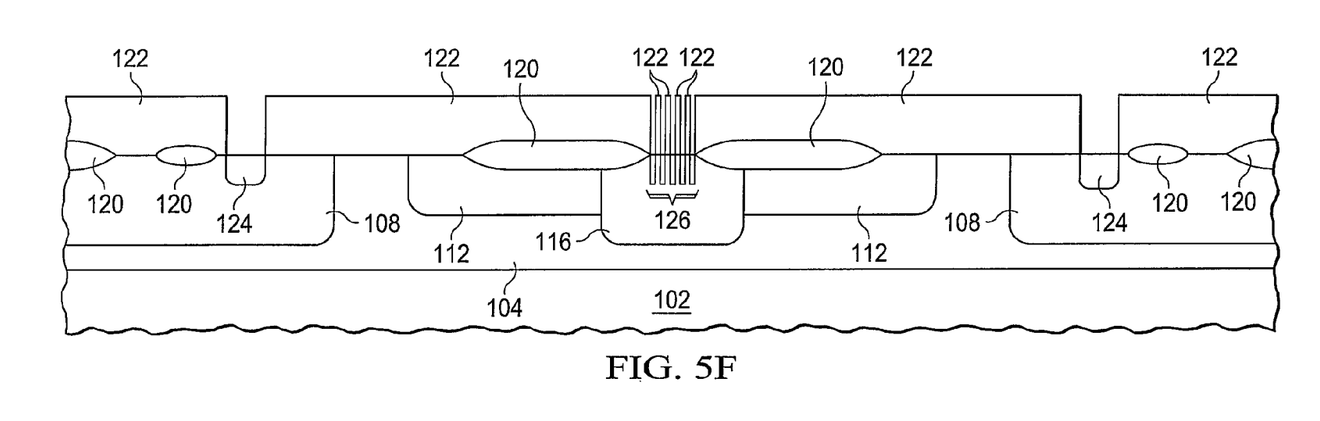
Figure 5G:
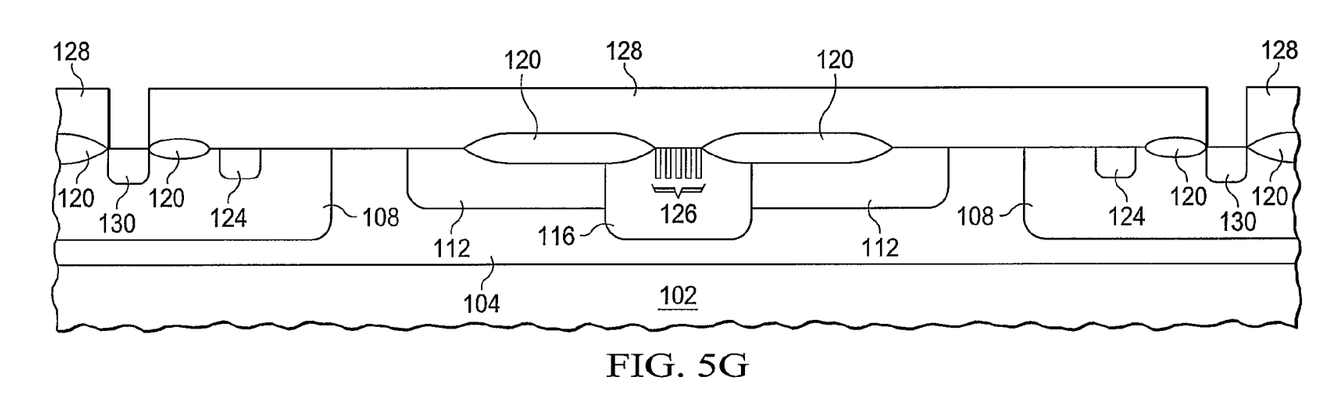

In FIG. 5F, another resist layer 122 is patterned on the epitaxial substrate to expose a portion of the p well 108 and a portion of the deep n well 116. The exposed deep n well 116 area consists of multiple areas distributed throughout the surface of the deep n well 116. N type dopants are then added to create an n+ region 124 in the p well 108 and multiple n+ regions 126 in the deep n well 116. In FIG. 5G, a resist layer 128 is patterned to expose an area of the p well 108 where a p+ region 130 is to be formed. The area is then doped using p type dopants.

Figure 5H:
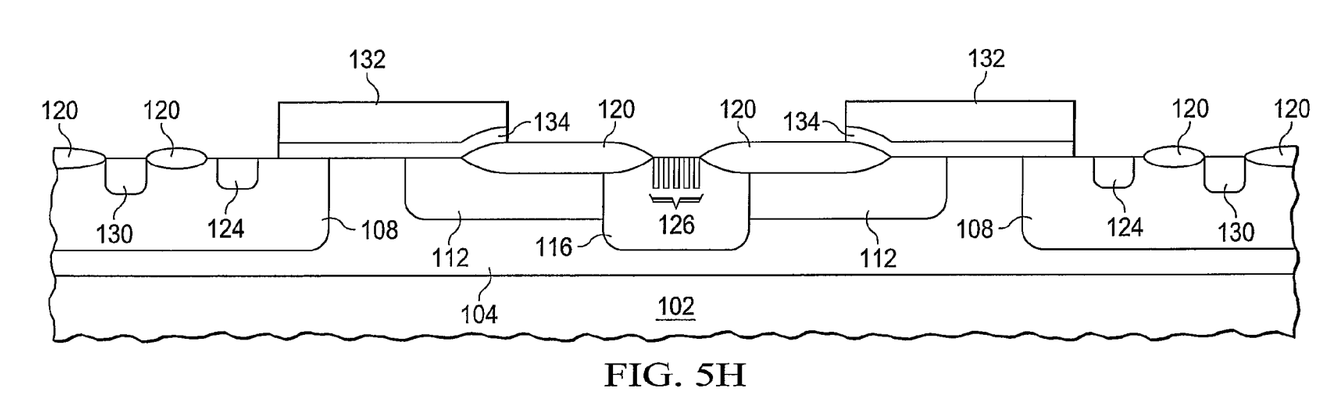

FIG. 5H illustrates a dielectric layer (not shown) formed on the epitaxial substrate 104 and a polysilicon layer (not shown) formed on the dielectric layer. A hardmask layer 132 is patterned to cover an area of the polysilicon layer where a gate structure will be formed. The polysilicon layer and dielectric layer are then etched to form the gate structure 134 on the epitaxial substrate 104. Other processes known in the art to form the gate structure 134 may also be used.

Figure 5I:
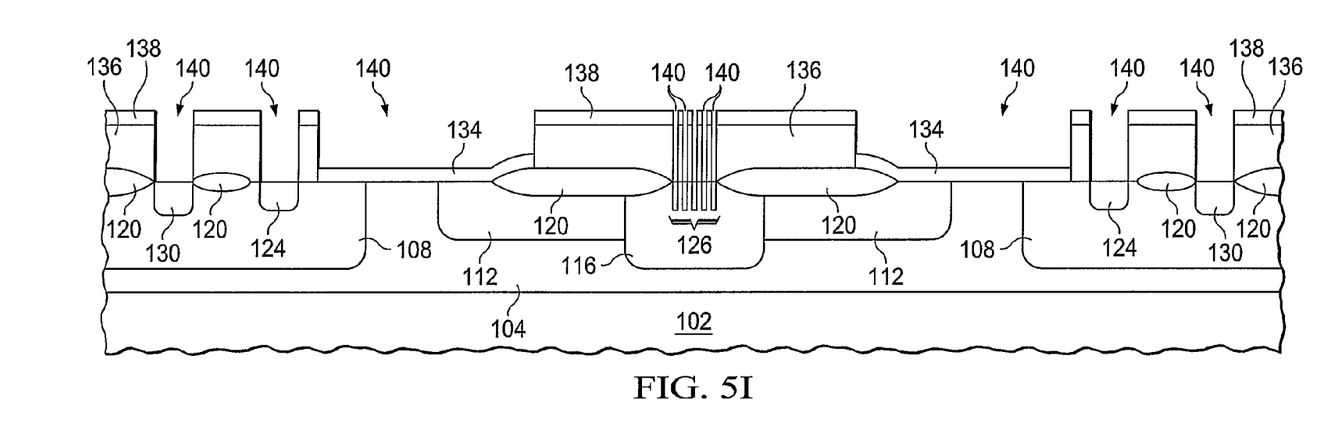
Figure 5J:
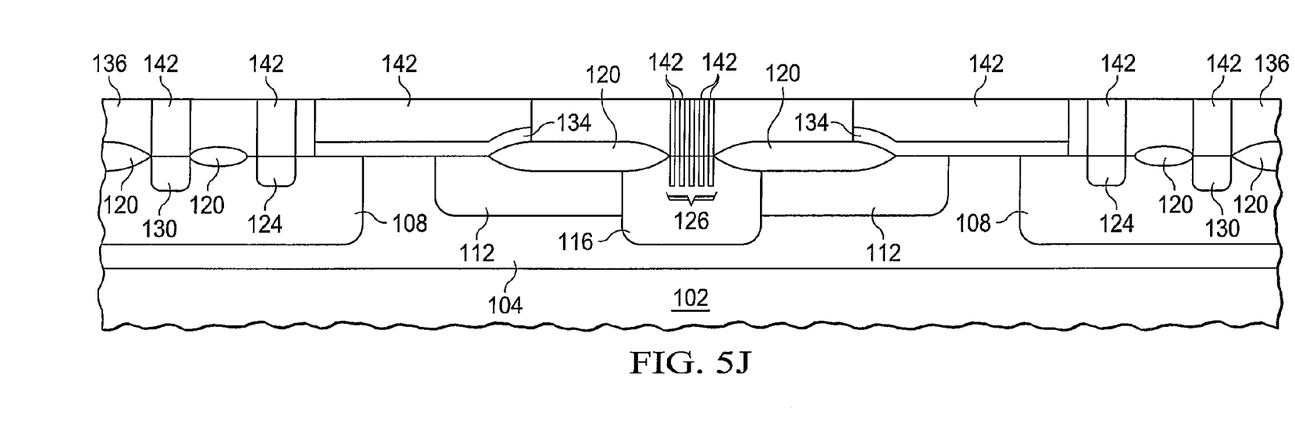

In FIG. 5I, the hardmask layer 132 is removed, and a dielectric layer 136 is formed over the epitaxial substrate 104. A hardmask 138 is formed on the dielectric layer 136 and patterned to expose areas of the dielectric layer 136 where contacts will be formed. The dielectric layer 136 is then etched to form openings 140, and the hardmask 138 is removed. As shown in FIG. 5J, the openings in the dielectric layer 136 are then filled with metal to form contacts 142, and any excess metal is removed by polishing, such as by chemical mechanical polishing.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An electrostatic discharge (ESD) protection device comprising:
   a p well disposed in a substrate;
   an n well disposed in the substrate;
   a high voltage n well (HVNW) disposed between the p well and the n well in the substrate;
   a source n+ region disposed in the p well; and
   a plurality of drain n+ regions disposed in the n well.

2. The ESD protection device of claim 1, further comprising a plurality of contacts, wherein each drain n+ region electrically couples at least one respective contact.

3. The ESD protection device of claim 1, wherein the n well has an area between 4,000 and 5,000 square micrometers, and wherein each of the plurality of drain n+ regions has an area between 4 and 6 square micrometers.

4. The ESD protection device of claim 1, wherein the n well has an area between 4,000 and 5,000 square micrometers, and wherein every edge of each drain n+ region is at least approximately one micrometer from every edge of other drain n+ regions.

5. The ESD protection device of claim 1, wherein the plurality of drain n+ regions comprise at least one hundred drain n+ regions.

6. The ESD protection device of claim 1, wherein the plurality of drain n+ regions are grouped together, and wherein the group is centrally located in the n well.

7. The ESD protection device of claim 6, wherein the n well has an area between 4,000 and 5,000 square micrometers, and wherein the group is disposed in an area between 2,000 and 2,500 square micrometers.

8. The ESD protection device of claim 6, wherein the n well has an area between 4,000 and 5,000 square micrometers, and wherein a concentration of the group of the plurality of drain n+ regions is between one drain n+ region per 15 square micrometers and one drain n+ region per 25 square micrometers.

9. The ESD protection device of claim 1, further comprising a p+ region disposed in the p well.

10. The ESD protection device of claim 1, further comprising a gate structure on the substrate between the source n+ region and the plurality of drain n+ regions.

11. A structure for an electrostatic discharge (ESD) device, the structure comprising:
    a drain comprising:
       a doped well doped with a first dopant type, and;
       a plurality of highly doped areas, wherein each of the plurality of highly doped areas is entirely within the doped well, wherein each of the plurality of highly doped areas is physically isolated from all others of the plurality of highly doped areas, the plurality of highly doped areas being highly doped with the first dopant type; and
    a plurality of contacts electrically coupled to the drain, wherein at least one contact is electrically coupled to each highly doped area of the drain.

12. The structure of claim 11, wherein the plurality of highly doped areas is clustered in the doped well with a concentration between one highly doped area per 15 square micrometers and one highly doped area per 25 square micrometers.

13. The structure of claim 11, wherein at least one micrometer separates each of the plurality of highly doped areas.

14. The structure of claim 11, wherein the plurality of highly doped areas comprises at least one hundred highly doped areas.

15. The structure of claim 11, wherein the doped well is an n doped well, and wherein the plurality of highly doped areas are n+ doped areas.

16. A structure comprising:
    a drain in a substrate, the drain comprising:
       a first doped well doped in the substrate, the first doped well being doped with a first dopant type, and;
       a plurality of highly doped regions, each of the plurality of highly doped regions being entirely within the first doped well and being physically separated from others of the plurality of highly doped regions, the plurality of highly doped regions being highly doped with the first dopant type; and
    a plurality of contacts extending from a first surface of a dielectric layer to a second surface of the dielectric layer, the dielectric layer being over the substrate, each of the plurality of highly doped regions of the drain being coupled to a respective one of the plurality of contacts.

17. The structure of claim 16 further comprising:
    a second doped well in the substrate, the second doped well being doped with a second dopant type opposite from the first dopant type; and
    a high voltage doped well in the substrate and between the first doped well and the second doped well, the high voltage doped well being doped with the first dopant type.

18. The structure of claim 17, wherein the first dopant type is an n-type dopant, and the second dopant type is a p-type dopant.

19. The structure of claim 17 further comprising:
an additional highly doped region in the second doped well, the additional highly doped region being doped with the first dopant type; and
a guard-ring region in the second doped well, the guard-ring region being doped with the second dopant type, the additionally highly doped region being between the guard-ring region and the first doped well.

* * * * *